US012624448B2

(12) United States Patent
Vermeulen et al.

(10) Patent No.: US 12,624,448 B2
(45) Date of Patent: May 12, 2026

(54) SYSTEMS, DEVICES, AND METHODS FOR FORMING LAYERS COMPRISING A GROUP 14 ELEMENT, A PNICTOGEN, AND A CHALCOGEN

(71) Applicant: ASM IP Holding B.V., Almere (NL)

(72) Inventors: Bart Vermeulen, Dresden (DE); Varun Sharma, Helsinki (FI); Jerome Innocent, Leuven (BE); Charles Dezelah, Helsinki (FI); Michael Eugene Givens, Oud-Heverlee (BE)

(73) Assignee: ASM IP Holding B.V., Amsterdam (NL)

( * ) Notice: Subject to any disclaimer, the term of this patent is extended or adjusted under 35 U.S.C. 154(b) by 0 days.

(21) Appl. No.: 18/518,042

(22) Filed: Nov. 22, 2023

(65) Prior Publication Data

US 2024/0175129 A1     May 30, 2024

Related U.S. Application Data

(60) Provisional application No. 63/385,159, filed on Nov. 28, 2022.

(51) Int. Cl.
C23C 16/455          (2006.01)
C23C 16/22            (2006.01)

(52) U.S. Cl.
CPC ........ C23C 16/45527 (2013.01); C23C 16/22 (2013.01); C23C 16/45553 (2013.01)

(58) Field of Classification Search
None
See application file for complete search history.

(56) References Cited

U.S. PATENT DOCUMENTS

| | | | |
|---|---|---|---|
| 9,214,630 B2 | 12/2015 | Xiao et al. | |
| 9,537,095 B2 | 1/2017 | Stender et al. | |
| 2010/0009078 A1 | 1/2010 | Pore et al. | |
| 2012/0028410 A1* | 2/2012 | Marsh .................. | H10N 70/231 438/102 |
| 2012/0329208 A1 | 12/2012 | Pore et al. | |
| 2014/0308802 A1* | 10/2014 | Xiao ................. | C23C 16/45525 438/483 |

(Continued)

OTHER PUBLICATIONS

Alkylsilyl Compounds of Selenium and Tellurium: New Precursors for ALD, T. HatanpÄ¤Ä¤, V. Pore, M. Ritala, and M. LeskelÄ¤, ECS Transactions, 25 (8) 609-616 (2009)10.1149/1.3207647 © The Electrochemical Society.

(Continued)

*Primary Examiner* — Joshua Allen
*Assistant Examiner* — Bradford M Gates
(74) *Attorney, Agent, or Firm* — Banner & Witcoff,. Ltd,

(57) ABSTRACT

Disclosed are methods for forming layers comprising a group 14 element, a pnictogen, and a chalcogen. In some embodiments, the group 14 element comprises germanium, the pnictogen comprises antimony, and the chalcogen comprises tellurium. The methods comprise executing a plurality of deposition cycles. A deposition cycle comprises exposing a substrate to two different group 14 precursors, to two different pnictogen precursors, or to two different chalcogen precursors. Further discloses are related systems and methods. Suitable systems include atomic layer deposition systems. Suitable devices include phase change memory devices.

19 Claims, 6 Drawing Sheets

200

(56)　　　　　References Cited

U.S. PATENT DOCUMENTS

2019/0006586 A1　　1/2019　Maes et al.

OTHER PUBLICATIONS

Atomic Layer Deposition of SnTe Thin Film Using Sn(N(CH3)2)4 and Te(Si(CH3)3)2 with Ammonia Coinjection, Lee et al, Cryst. Growth Des. 2020, 20, 7, 4649-4656.

Cheng, Lanxia, et al. "Conformal deposition of GeTe films with tunable Te composition by atomic layer deposition." Journal of Vacuum Science Technology A: Vacuum, Surfaces, and Films 37.2 (2019): 020907.

High Speed Phase Change Memory Based on SnTe-Doped Ge2Sb2Te5 Material, Jian'an Xu et al.2011 Electrochem. Solid-State Lett. 15 H59.

Phase change behaviors of Sn-doped Ge—Sb—Te material, Song et al., Appl. Phys. Lett. 90, 091904 (2007).

Pore, Viljami, et al. "Atomic layer deposition of antimony and its compounds using dechlorosilylation reactions of tris (triethylsilyl) antimony." Chemistry of Materials 23.2 (2011): 247-254.

Reaction Mechanism for Atomic Layer Deposition of Germanium Ditelluride Thin Films. B. Han et al., Journal of Nanoscience and Nanotechnology vol. 17, 3472-3476, 2017.

* cited by examiner

200

211
Position a substrate on a substrate support

212
First Group 14 Element Precursor Pulse

213
Second Group 14 Element Precursor Pulse

219

214
First Pnictogen Precursor Pulse

215
Second Pnictogen Precursor Pulse

216
First Chalcogen Precursor Pulse

217
Second Chalcogen Precursor Pulse

218
End

300

311

Position a substrate on a substrate support

312

First Group 14 Element Precursor Pulse

321

313

First Pnictogen Precursor Pulse

319

314

First Chalcogen Precursor Pulse

315

Second Group 14 Element Precursor Pulse

322

316

Second Pnictogen Precursor Pulse

317

Second Chalcogen Precursor Pulse

318

End

501

511
Chalcogen Precursor Pulse

512
Pnictogen Precursor Pulse

513
Group 14 Element Precursor Pulse

502

521
Pnictogen Precursor Pulse

522
Chalcogen Precursor Pulse

523
Group 14 Element Precursor Pulse

503

531
Pnictogen Precursor Pulse

532
Group 14 Element Precursor Pulse

533
Chalcogen Precursor Pulse

1

SYSTEMS, DEVICES, AND METHODS FOR FORMING LAYERS COMPRISING A GROUP 14 ELEMENT, A PNICTOGEN, AND A CHALCOGEN

CROSS-REFERENCE TO RELATED APPLICATION(S)

This application claims the benefit of U.S. Provisional Application 63/385,159 filed on Nov. 28, 2022, the entire contents of which are incorporated herein by reference.

FIELD OF INVENTION

The present disclosure generally relates to the field of semiconductor processing methods, devices, and systems, and to the field of integrated circuit manufacture. In particular, methods and systems suitable for forming layers comprising a group 14 element, a pnictogen, and a chalcogen. Further disclosed are related systems and devices.

BACKGROUND OF THE DISCLOSURE

Phase change materials have been proposed as memory elements for advanced semiconductor circuits. One class of candidate materials includes materials that comprise a group 14 element, a pnictogen precursor, and a chalcogen precursor. Exemplary materials in this class include germanium antimony telluride (GeSbTe).

However, there remains to be a need for improved phase change materials. In particular, there remains a need for phase change materials improved durability. There additionally remains a need for phase change materials with improved phase stability. There additionally remains a need for phase change materials that can be deposited in a conformal way. There remains a need for homogeneous phase change materials. The remains a need for phase change memory cells having high endurance.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Described herein is a method of forming a layer comprising a group 14 element, a pnictogen, and a chalcogen, the method comprising: providing a substrate to a reaction chamber; executing a plurality of deposition cycles, a deposition cycle comprising a group 14 element pulse, a pnictogen pulse, and a chalcogen pulse; wherein the group 14 element pulse comprises providing a first group 14 element to the reaction chamber; the pnictogen pulse comprises providing a first pnictogen precursor to the reaction chamber; and, the chalcogen pulse comprises providing a first chalcogen precursor to the reaction chamber; wherein the method further comprises providing one or more further precursors to the reaction chamber, the one or more further precursors comprising a precursor being selected from a second group 14 element precursor being different than the first group 14 element precursor, a second pnictogen precursor being different from the first pnictogen precursor, and a second chalcogen precursor being different from the first chalcogen precursor.

In some embodiments, the one or more further precursors comprise the second group 14 element precursor, and the group 14 element pulse further comprises providing the second group 14 element precursor to the reaction chamber.

In some embodiments, the second precursor comprises the second pnictogen precursor, and the pnictogen pulse further comprises providing the second pnictogen precursor to the reaction chamber.

In some embodiments, the second precursor comprises the second chalcogen precursor, and the chalcogen pulse further comprises the second chalcogen precursor to the reaction chamber.

Further described herein is a method of forming a layer comprising a group 14 element, a pictogen, and a chalcogen, the method comprising: providing a substrate to a reaction chamber; executing a plurality of deposition cycles, ones from the plurality of deposition cycles comprising a first sub cycle and a second sub cycle; the first sub cycle comprising a first group 14 element pulse, a first pnictogen pulse, and a first chalcogen pulse, wherein the first group 14 element pulse comprises providing a first group 14 element to the reaction chamber; the first pnictogen pulse comprises providing a first pnictogen precursor to the reaction chamber; and, the first chalcogen pulse comprises providing a first chalcogen precursor to the reaction chamber; the second sub cycle comprising a second group 14 element pulse, a second pnictogen pulse, and a second chalcogen pulse, wherein the second group 14 element pulse comprises providing a second group 14 element to the reaction chamber; the second pnictogen pulse comprises providing a second pnictogen precursor to the reaction chamber; and, the second chalcogen pulse comprises providing a second chalcogen precursor to the reaction chamber.

In some embodiments, the first group 14 element precursor is different from the second group 14 element precursor.

In some embodiments, the first pnictogen precursor is different from the second pnictogen precursor.

In some embodiments, the first chalcogen precursor is different from the second chalcogen precursor.

In some embodiments, ones from the plurality of deposition cycles comprise more than one first sub cycle.

In some embodiments, ones from the plurality of deposition cycles comprise more than one second sub cycle.

In some embodiments, the first group 14 element precursor comprises a first germanium precursor and wherein the second group 14 element precursor comprises a second germanium precursor.

In some embodiments, at least one of the first germanium precursor and the second germanium precursor comprises a germanium amidinate, a germanium amide, or a germanium halide.

In some embodiments, one of the first germanium precursor and the second germanium precursor comprises GeHCl$_3$.

In some embodiments, the first pnictogen precursor comprises a first antimony precursor and the second pnictogen precursor comprises a second antimony precursor.

In some embodiments, at least one of the first antimony precursor and the second antimony precursor independently comprise a compound selected from the list consisting of an antimony halide, a heteroleptic antimony precursor comprising an alkylsilyl group and a halogen, a silyl antimonide, an antimony amide, and an antimony alkyl.

In some embodiments, one of the first antimony precursor and the second antimony precursor comprises a chemical bond between antimony and a group 14 element.

In some embodiments, the first chalcogen precursor comprises a first tellurium precursor or wherein the second chalcogen precursor comprises a second tellurium precursor.

In some embodiments, at least one of the first tellurium precursor and the second tellurium precursor comprise a compound selected from the list consisting of a tellurium halide, a tellurium alkoxide, and a tellurium alkylsilyl.

In some embodiments, one of the first tellurium precursor and the second tellurium precursor comprises a chemical bond between tellurium and a group 14 element.

Further described herein is a system comprising: a reaction chamber, the reaction chamber comprising a substrate support; a gas injection system fluidly coupled to the reaction chamber; a first group 14 element precursor gas source for introducing a first group 14 element precursor in the reaction chamber; a first pnictogen precursor gas source for introducing a first pnictogen precursor in the reaction chamber; a first chalcogen precursor gas source for introducing a first chalcogen precursor in the reaction chamber; one or more further precursor gas sources, ones from the one or more further precursor gas sources being selected from a second group 14 element precursor gas source for introducing a second group 14 element precursor into the reaction chamber, the second group 14 element precursor being different than the first group 14 element precursor; a second pnictogen precursor gas source for introducing a second pnictogen precursor into the reaction chamber, the second pnictogen precursor being different from the first pnictogen precursor; a second chalcogen precursor gas source for introducing a second chalcogen precursor gas into the reaction chamber, the second chalcogen precursor being different from the first chalcogen precursor; an exhaust; and, a controller being constructed and arranged to cause the system to carry out a method as described herein.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWINGS

A more complete understanding of the embodiments of the present disclosure may be derived by referring to the detailed description and claims when considered in connection with the following illustrative figures.

Figure 1:
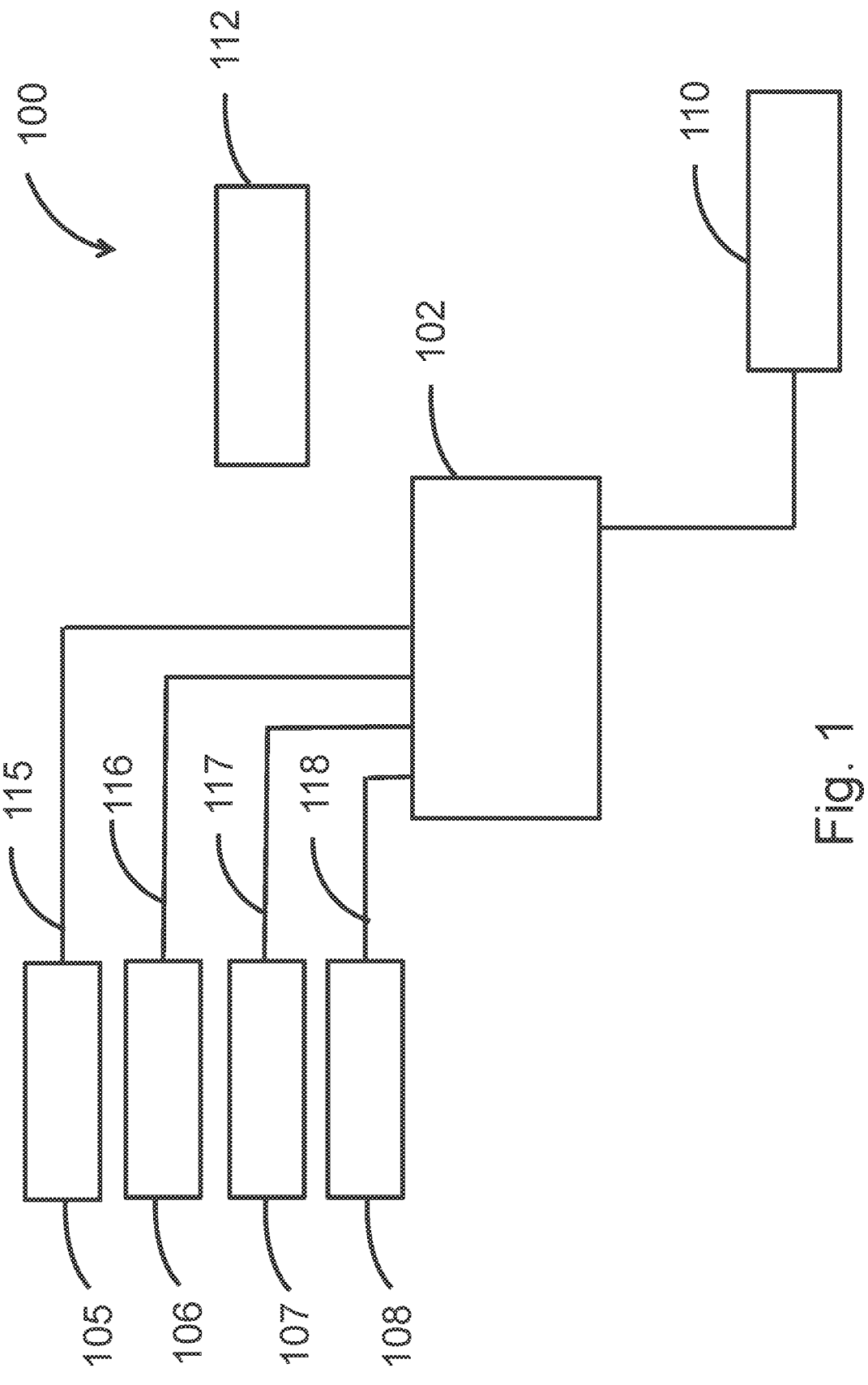
FIG. 1 describes a system that can be used to perform a method as described herein and/or form a structure or device portion as described herein.

As illustrated in the figures, the sizes of the elements, features, and other structures may be exaggerated or not depicted proportionally for illustrative purposes. Thus, the figures are provided to illustrate the general elements of the embodiments.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert gases include helium, argon, and any combination thereof.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/ and/or embedded in a device manufactured on that substrate. A film or layer may comprise material or a layer with pinholes and/or isolated islands. A film or layer may be at least partially continuous.

The term "deposition process" as used herein can refer to the introduction of precursors (and/or reactants) into a reaction chamber to deposit a layer over a substrate. "Cyclical deposition processes" are examples of "deposition processes".

The term "cyclical deposition process" can refer to a sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component. A cyclical deposition process may or may not comprise self-limiting surface reactions.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reactor chamber in between two pulses of gasses which react with each other. For example, a purge, e.g. using nitrogen gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

As used herein, the term "substrate" may refer to any underlying material or materials that may be used, or upon which, a device, a circuit, or a film may be formed. The "substrate" may be continuous or non-continuous; rigid or flexible; solid or porous. The substrate may be in any form such as a powder, a plate, or a workpiece. Substrates in the form of a plate may include wafers in various shapes and sizes. Substrates may be made from materials, such as silicon, silicon germanium, silicon oxide, gallium arsenide, gallium nitride and silicon carbide for example. A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc. A substrate may comprise additional layers, features, and structures.

In some embodiments, the substrate can have the form of a powder. A porous substrate may comprise polymers. Workpieces may comprise components for battery manufacturing (i.e., anodes, cathodes, or separators) or components of photovoltaic cells.

A continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a non-woven film, a roll, a foil, a web, a flexible material, a bundle of continuous filaments or fibers (i.e. ceramic fibers or polymer fibers). Continuous substrates may also comprise carriers or sheets upon which non-continuous substrates are mounted.

Described herein are methods for forming materials, such as layers comprising a material, such as a layer comprising a phase change material. Methods as described herein advantageously employ cyclical deposition processes such as atomic layer deposition. Advantageously, methods as described herein allow conformal deposition on patterned substrates comprising three-dimensional features such as gaps, recesses, and even reentrant features. Also, the presently disclosed methods advantageously provide for phase change materials with improved compositional control.

In particular, described herein is a method of forming a layer that comprises a group 14 element, a pnictogen, and a chalcogen.

The method comprises providing a substrate to a reaction chamber.

The method further comprises executing a plurality of deposition cycles. A deposition cycle comprises a group 14 element pulse, a pnictogen pulse, and a chalcogen pulse.

The group 14 element pulse comprises providing a first group 14 element to the reaction chamber The pnictogen pulse comprises providing a first pnictogen precursor to the reaction chamber.

The chalcogen pulse comprises providing a first chalcogen precursor to the reaction chamber.

Further described herein is a method of forming a layer that comprises a group 14 element and a chalcogen. The method comprises providing a substrate to a reaction chamber. The method further comprises executing a plurality of deposition cycles. A deposition cycle consecutively comprises a first sub cycle and a second sub cycle. The first sub cycle comprises a first group 14 element pulse and a first chalcogen pulse. The second sub cycle comprises a second group 14 element pulse and a second chalcogen pulse.

The first group 14 element pulse comprises providing a first group 14 element to the reaction chamber. The second group 14 element pulse comprises providing a second group 14 element to the reaction chamber.

The first pnictogen pulse comprises providing a first pnictogen precursor to the reaction chamber. The second pnictogen pulse comprises providing a second pnictogen precursor to the reaction chamber.

The first chalcogen pulse comprises providing a first chalcogen precursor to the reaction chamber. The second chalcogen pulse comprises providing a second chalcogen precursor to the reaction chamber.

In some embodiments, a method as described herein can comprise employing two different precursors for the same element. Such embodiments can allow enhanced compositional tuning. Thus, further described herein is a method of forming a layer that comprises a group 14 element, a pnictogen, and a chalcogen.

The method comprises providing a substrate to a reaction chamber.

The method further comprises executing a plurality of deposition cycles. A deposition cycle comprises a group 14 element pulse, a pnictogen pulse, and a chalcogen pulse.

The group 14 element pulse comprises providing a first group 14 element to the reaction chamber The pnictogen pulse comprises providing a first pnictogen precursor to the reaction chamber.

The chalcogen pulse comprises providing a first chalcogen precursor to the reaction chamber.

The method further comprises providing one or more further precursors to the reaction chamber. The one or more further precursors comprise a precursor selected from a second group 14 element precursor, a second pnictogen precursor, and a second chalcogen precursor. The second group 14 element precursor is different than the first group 14 element precursor. The second pnictogen precursor is different from the first pnictogen precursor. The second chalcogen precursor is different from the first chalcogen precursor.

In some embodiments, a first precursor and a second precursor can be provided in the same pulse, or in adjacent pulses.

In some embodiments, the one or more further precursors comprise the second group 14 element precursor, and the group 14 element pulse further comprises providing the second group 14 element precursor to the reaction chamber.

In some embodiments, the second precursor comprises the second pnictogen precursor, and the pnictogen pulse further comprises providing the second pnictogen precursor to the reaction chamber In some embodiments, the second precursor comprises the second chalcogen precursor, and the chalcogen pulse further comprises providing the chalcogen precursor to the reaction chamber.

In some embodiments, the various precursors can be provided in distinct sub cycles comprised in a master cycle.

Thus, further described herein is a method of forming a layer that comprises a group 14 element, a pnictogen, and a chalcogen. The method comprises providing a substrate to a reaction chamber. The method further comprises executing a plurality of deposition cycles. A deposition cycle comprises a group 14 element pulse, a pnictogen pulse, and a chalcogen pulse. The group 14 element pulse comprises providing a first group 14 element to the reaction chamber. The pnictogen pulse comprises providing a first pnictogen precursor to the reaction chamber. The chalcogen pulse comprises providing a first chalcogen precursor to the reaction chamber.

In some embodiments, the group 14 element pulse further comprises providing a second group 14 element precursor to the reaction chamber. The first group 14 element precursor and the second group 14 element precursor are different.

In some embodiments, the pnictogen pulse further comprises providing a second pnictogen precursor to the reaction chamber. The first pnictogen precursor and the second pnictogen precursor are different.

In some embodiments, the chalcogen pulse further comprises providing a second chalcogen precursor to the reaction chamber. The first chalcogen precursor and the second chalcogen precursor are different.

As described elsewhere herein, a method as described herein can comprise providing a first precursor and a second precursor to a reaction chamber simultaneously, in partially overlapping pulses, or sequentially. Doing so can advantageously allow compositional tuning of layers. Additionally or alternatively, layer composition can be tuned by employing sub cycles and super cycles.

Thus, further described herein is a method of forming a layer that comprises a group 14 element, a pnictogen, and a chalcogen. The method comprises providing a substrate to a reaction chamber. The method further comprises executing a plurality of deposition cycles. Ones from the plurality of deposition cycles comprise a first sub cycle and a second sub cycle. The first sub cycle comprises a first group 14 element pulse, a first pnictogen pulse, and a first chalcogen pulse. The first group 14 element pulse comprises providing a first group 14 element to the reaction chamber. The first pnictogen pulse comprises providing a first pnictogen precursor to the reaction chamber. The first chalcogen pulse comprises providing a first chalcogen precursor to the reaction chamber.

The second sub cycle comprises a second group 14 element pulse, a second pnictogen pulse, and a second chalcogen pulse. The second group 14 element pulse comprises providing a second group 14 element to the reaction chamber. The second pnictogen pulse comprises providing a second pnictogen precursor to the reaction chamber. The second chalcogen pulse comprises providing a second chalcogen precursor to the reaction chamber.

In some embodiments, ones from the plurality of deposition cycles comprise more than one first sub cycle.

In some embodiments, ones from the plurality of deposition cycles comprise more than one second sub cycle.

A method according to the present disclosure can be described in yet different terms. Thus, further described herein is a method of forming a layer. The layer comprises a group 14 element, a pnictogen, and a chalcogen. The method comprises providing a substrate to a reaction chamber. The method further comprises executing a plurality of deposition cycles. Ones from the plurality of deposition cycles comprise a first sub cycle and a second sub cycle. The first sub cycle comprises a first group 14 element pulse, a first pnictogen pulse, and a first chalcogen pulse. The first group 14 element pulse comprises providing a first group 14 element to the reaction chamber. The first pnictogen pulse comprises providing a first pnictogen precursor to the reaction chamber. The first chalcogen pulse comprises providing a first chalcogen precursor to the reaction chamber. The second sub cycle comprises a second group 14 element pulse, a second pnictogen pulse, and a second chalcogen pulse. The second group 14 element pulse comprises providing a second group 14 element to the reaction chamber. The second pnictogen pulse comprises providing a second pnictogen precursor to the reaction chamber. The second chalcogen pulse comprises providing a second chalcogen precursor to the reaction chamber.

In some embodiments, first group 14 element precursor is different from the second group 14 element precursor. In some embodiments, the first pnictogen precursor is different from the second pnictogen precursor. In some embodiments, the first chalcogen precursor is different from the second chalcogen precursor.

In some embodiments, the first group 14 element precursor is different from the second group 14 element precursor. In some embodiments, the first group 14 element precursor and the second group 14 element precursor are independently selected from a silicon precursor, a germanium precursor, and a tin precursor.

In some embodiments, the group 14 element precursor does not comprise oxygen.

In some embodiments, at least one of the group 14 element precursor and the second group 14 element precursor comprises a tin precursor. Suitable tin precursors include chlorides and alkoxides. In some embodiments, the tin precursor comprises a tin alkylamine such as $Sn(N(CH_3)_2)_4$.

In some embodiments, at least one of the first tin precursor and the second tin precursor comprises a tin halide. Suitable tin halides can have the formula $SnH_{4-n}X_n$, with n being an integer from 1 to 4 and X being selected from the group consisting of F, Cl, Br, and I. In some embodiments, suitable Tin halides can have the formula $SH_{4-n}X_n$, with n being an integer from 1 to 4 and X being selected from the group consisting of F, Cl, Br, and I. In some embodiments, X is Cl. In some embodiments, X is Cl, Br, or I. In some embodiments, X is F, Cl, or I. In some embodiments, X is F, Cl, or Br. In some embodiments, the tin precursor comprises $SnH_3Cl$. In some embodiments, the tin precursor comprises $SnH_2Cl_2$. In some embodiments, the tin precursor comprises $SnHCl_3$. In some embodiments, the tin precursor comprises $SnCl_4$.

In some embodiments, the first tin precursor comprises $SnH_2Cl_2$ and the second tin precursor comprises $SnHCl_3$. In some embodiments, the second tin precursor comprises $SnH_2Cl_2$ and the first tin precursor comprises $SnHCl_3$. Such a combination of tin precursors can be advantageously used in combination with one or more tellurium precursors and optionally one or more antimony precursors as disclosed herein, for example in order to form a SnTe or a SnSbTe layer.

In some embodiments, the first Tin precursor comprises $SnCl_4$ and the second tin precursor comprises $SnHCl_3$.

In some embodiments, the second tin precursor comprises $SnCl_4$ and the first tin precursor comprises $SnHCl_3$.

Using the two different Tin precursors can advantageously be used to control the tin content in SnSbTe layers, i.e. layers comprising tin, antimony, and tellurium. The tin content can be particularly controlled to obtain a ratio of tin to antimony to tellurium of 2:2:5, i.e. to obtain a SnSbTe layer in which for every 9 atoms, there are about two tin atoms, two antimony atoms, and five tellurium atoms.

In some embodiments, the tin precursor, for example at least one of the first tin precursor and the second tin precursor, comprises one or more amidinate ligands. Suitable Tin precursors include bis(amidinate)tin complexes such as bis(amidinate)tin (IV) dichloride ($[MeC(NiPr)_2]_2SnCl_2$) and bis(amidinate)Tin (II) ($[MeC(NiPr)_2]_2Sn$).

In some embodiments, the tin precursor, for example at least one of the first tin precursor and the second tin precursor, comprises an amide. Suitable amides include Bis[bis(trimethylsilyl)amino]-tin (II), which has an advantageously high vapor pressure of around 0.5 torr at a temperature of 60° C. Other suitable amines include Tetrakis (dimethylamino)tin(IV), which has a relatively low boiling point of 203° C.

In some embodiments, the tin precursor, for example at least one of the first tin precursor and the second tin precursor, comprises a tin halide, such as a tin chloride, a tin bromide, or a tin iodide. Suitable tin halides include $SnCl_2$: dioxane, $SnCl_4$, $SnBr_2$, N,N'-Di-t-butyl ethylenediamine tin dichloride, $SnCl_2:PH_3$, and $SnCl_2:PR_3$ with R being an alkyl such as a C1 to C6 alkyl such as methyl.

In some embodiments, the first group 14 element precursor comprises a first germanium precursor and the second group 14 element precursor comprises a second germanium precursor.

In some embodiments, at least one of the first germanium precursor and the second germanium precursor comprises a germanium amidinate, a germanium amide, or a germanium halide.

In some embodiments, at least one of the first germanium precursor and the second germanium precursor comprises a germanium halide. Suitable germanium halides can have the formula $GeH_{4-n}X_n$, with n being an integer from 1 to 4 and X being selected from the group consisting of F, Cl, Br, and I. In some embodiments, suitable germanium halides can have the formula $Ge_2H_{6-n}X_n$, with n being an integer from 1 to 6 and X being selected from the group consisting of F, Cl, Br, and I. In some embodiments, X is Cl. In some embodiments, X is Cl, Br, or I. In some embodiments, X is F, Cl, or I. In some embodiments, X is F, Cl, or Br. In some embodiments, the germanium precursor comprises $GeH_3Cl$. In some embodiments, the germanium precursor comprises $GeH_2Cl_2$. In some embodiments, the germanium precursor comprises $GeHCl_3$. In some embodiments, the germanium precursor comprises $GeCl_4$.

In some embodiments, the first germanium precursor comprises $GeH_2Cl_2$ and the second germanium precursor comprises $GeHCl_3$. In some embodiments, the second germanium precursor comprises $GeH_2Cl_2$ and the first germanium precursor comprises $GeHCl_3$. Such a combination of germanium precursors can be advantageously used in combination with one or more tellurium precursors and optionally one or more antimony precursors as disclosed herein, for example in order to form a GeTe or a GeSbTe layer.

In some embodiments, the first germanium precursor comprises $GeCl_4$ and the second germanium precursor comprises $GeHCl_3$.

In some embodiments, the second germanium precursor comprises $GeCl_4$ and the first germanium precursor comprises $GeHCl_3$.

Using the two different germanium precursors can advantageously be used to control the germanium content in GeSbTe layers, i.e. layers comprising germanium, antimony, and tellurium. The germanium content can be particularly control to obtain a ratio of germanium to antimony to tellurium of 2:2:5, i.e. to obtain a GeSbTe layer in which for every 9 atoms, there are about two germanium atoms, two antimony atoms, and five tellurium atoms.

In some embodiments, the germanium precursor, for example at least one of the first germanium precursor and the second germanium precursor, comprises one or more amidinate ligands. Suitable germanium precursors include Bis (amidinate)Germanium complexes such as Bis(amidinate) Germanium (IV) dichloride ([MeC(N$^i$Pr)$_2$]$_2$GeCl$_2$) and Bis (amidinate)Germanium (II) ([MeC(N$^i$Pr)$_2$]$_2$Ge).

In some embodiments, the germanium precursor, for example at least one of the first germanium precursor and the second germanium precursor, comprises an amide. Suitable amides include Bis[bis(trimethylsilyl)amino]-Germanium (II), which has an advantageously high vapor pressure of around 0.5 torr at a temperature of 60° C. Other suitable amines include Tetrakis(dimethylamino)germanium(IV), which has a relatively low boiling point of 203° C.

In some embodiments, the germanium precursor, for example at least one of the first germanium precursor and the second germanium precursor, comprises a germanium halide, such as a germanium chloride, a germanium bromide, or a germanium iodide. Suitable germanium halides include GeCl$_2$:Dioxane, GeCl$_4$, GeBr$_2$, N,N'-Di-t-butyl ethylenediamine germanium dichloride, GeCl$_2$:PH$_3$, and GeCl$_2$:PR$_3$ with R being an alkyl such as a C1 to C6 alkyl such as methyl.

In some embodiments, the first pnictogen precursor is different from the second pnictogen precursor.

In some embodiments, the pnictogen precursor does not comprise oxygen.

In some embodiments, the pnictogen precursor comprises a phosphorous precursor. Suitable phosphorous precursors include trialkyl phosphates such as trimethyl phosphate and triethyl phosphate.

In some embodiments, the first pnictogen precursor comprises a first arsenic precursor and the second pnictogen precursor comprises a second arsenic precursor.

In some embodiments, at least one of the first arsenic precursor and the second arsenic precursor independently comprise a compound selected from the list consisting of an arsenic halide, a heteroleptic arsenic precursor comprising an alkylsilyl group and a halogen, a silyl arsenide, an arsenic amide, and an arsenic alkyl.

In some embodiments, one of the first arsenic precursor and the second arsenic precursor comprises a chemical bond between arsenic and a group 14 element. Thus, in some embodiments, one of the first arsenic precursor and the second arsenic precursors comprises an arsenic germyl and an arsenic silyl.

In some embodiments, the first arsenic precursor comprises AsCl$_3$ and the second arsenic precursor comprises As(Si(CH$_3$)$_3$)$_2$. In some embodiments, the first arsenic precursor comprises AsCl$_3$ and the second arsenic precursor comprises As(Si(CH$_3$)$_3$)$_3$.

In some embodiments, the second arsenic precursor comprises AsCl$_3$ and the first arsenic precursor comprises As(Si (CH$_3$)$_3$)$_2$. In some embodiments, the second arsenic precursor comprises AsCl$_3$ and the first arsenic precursor comprises As(Si(CH$_3$)$_3$)$_3$.

In some embodiments, the arsenic precursor, for example at least one of the first arsenic precursor and the second arsenic precursor, comprises an arsenic atom bonded to an alkyl and to a halogen, such as chlorine. Suitable precursors include RAsCl$_2$ and R$_2$AsCl; with R being a C1 to C6 alkyl such as methyl.

In some embodiments, the arsenic precursor, for example at least one of the first arsenic precursor and the second arsenic precursor, comprises an alkylsilyl group and a halogen such as chlorine. Suitable arsenic precursors include tris[bis(trimethylsilyl)methyl]arsenic chloride, bis[bis(trimethylsilyl)methyl]arsenic (III) chloride ([(Me$_3$Si)$_2$CH]$_2$ AsCl), tris[(trimethylsilyl)methyl]arsenic(III)dichloride ((Me$_3$Si)$_3$CAsCl$_2$), bis[(trimethylsilyl)methyl] arsenic (III) dichloride ((Me$_3$Si)$_2$CHAsCl$_2$), and (bis[(trimethylsilyl)methyl] arsenic [(Me$_3$Si)$_2$CH]$_3$As).

In some embodiments, the arsenic precursor, for example at least one of the first arsenic precursor and the second arsenic precursor, comprises a silyl arsenide such as an alkylsilyl arsenide such as tris(trimethylsilyl) arsenic (III) (As(SiMe$_3$)$_3$).

In some embodiments, the arsenic precursor, for example at least one of the first arsenic precursor and the second arsenic precursor, comprises a germyl arsenide such as As(GeMe$_3$)$_3$.

In some embodiments, the arsenic precursor, for example at least one of the first arsenic precursor and the second arsenic precursor, comprises an arsenic halide such as arsenic chloride, arsenic bromide, or arsenic iodide.

In some embodiments, the arsenic precursor, for example at least one of the first arsenic precursor and the second arsenic precursor, comprises an arsenic amide such as As(NMe$_2$)$_3$.

In some embodiments, the arsenic precursor, for example at least one of the first arsenic precursor and the second arsenic precursor, comprises an arsenic alkyl such as As(R)$_3$, with R being a C1 to C6 alkyl. For example, a suitable arsenic alkyl can comprise As(Et)$_3$, with Et short for ethyl.

In some embodiments, the first pnictogen precursor comprises a first bismuth precursor and the second pnictogen precursor comprises a second bismuth precursor.

In some embodiments, at least one of the first bismuth precursor and the second bismuth precursor independently comprise a compound selected from the list consisting of an bismuth halide, a heteroleptic bismuth precursor comprising an alkylsilyl group and a halogen, a bismuth silyl, a bismuth amide, and a bismuth alkyl.

In some embodiments, one of the first bismuth precursor and the second bismuth precursor comprises a chemical bond between bismuth and a group 14 element. Thus, in some embodiments, one of the first bismuth precursor and the second bismuth precursors comprises a bismuth germyl or a bismuth silyl.

In some embodiments, the first bismuth precursor comprises BiCl$_3$ and the second bismuth precursor comprises Bi(Si(CH$_3$)$_3$)$_2$. In some embodiments, the first bismuth precursor comprises BiCl$_3$ and the second bismuth precursor comprises Bi(Si(CH$_3$)$_3$)$_3$.

In some embodiments, the second bismuth precursor comprises BiCl$_3$ and the first bismuth precursor comprises Bi(Si(CH$_3$)$_3$)$_2$. In some embodiments, the second bismuth precursor comprises BiCl$_3$ and the first bismuth precursor comprises Bi(Si(CH$_3$)$_3$)$_3$.

In some embodiments, the bismuth precursor, for example at least one of the first bismuth precursor and the second bismuth precursor, comprises an bismuth atom bonded to an alkyl and to a halogen, such as chlorine. Suitable precursors include RBiCl$_2$ and R$_2$BiCl; with R being a C1 to C6 alkyl such as methyl.

In some embodiments, the bismuth precursor, for example at least one of the first bismuth precursor and the second bismuth precursor, comprises an alkylsilyl group and a halogen such as chlorine. Suitable bismuth precursors include tris[bis(trimethylsilyl)methyl]bismuth chloride, bis [bis(trimethylsilyl)methyl]bismuth (III) chloride ([(Me$_3$Si)$_2$ CH]$_2$BiCl), tris[(trimethylsilyl)methyl]bismuth(III)dichloride (Me$_3$Si)$_3$CBiCl$_2$), bis[(trimethylsilyl)methyl] bismuth (III) dichloride ((Me$_3$Si)$_2$CHBiCl$_2$), and (bis[(trimethylsilyl)methyl] bismuth [(Me$_3$Si)$_2$CH]$_3$Bi).

In some embodiments, the bismuth precursor, for example at least one of the first bismuth precursor and the second bismuth precursor, comprises a bismuth silyl such as a bismuth alkylsilyl such as tris(trimethylsilyl) bismuth (III) (Bi(SiMe$_3$)$_3$).

In some embodiments, the bismuth precursor, for example at least one of the first bismuth precursor and the second bismuth precursor, comprises a bismuth germyl such as Bi(GeMe$_3$)$_3$.

In some embodiments, the bismuth precursor, for example at least one of the first bismuth precursor and the second bismuth precursor, comprises an bismuth halide such as bismuth chloride, bismuth bromide, or bismuth iodide.

In some embodiments, the bismuth precursor, for example at least one of the first bismuth precursor and the second bismuth precursor, comprises an bismuth amide such as Bi(NMe$_2$)$_3$.

In some embodiments, the bismuth precursor, for example at least one of the first bismuth precursor and the second bismuth precursor, comprises an bismuth alkyl such as Bi(R)$_3$, with R being a C1 to C6 alkyl. For example, a suitable bismuth alkyl can comprise Bi(Et)$_3$, with Et short for ethyl.

In some embodiments, the first pnictogen precursor comprises a first antimony precursor and the second pnictogen precursor comprises a second antimony precursor. In some embodiments, the first pnictogen precursor and the second pnictogen precursor are independently selected from a phosphorous precursor, an arsenic precursor, and an antimony precursor.

In some embodiments, at least one of the first antimony precursor and the second antimony precursor independently comprise a compound selected from the list consisting of an antimony halide, a heteroleptic antimony precursor comprising an alkylsilyl group and a halogen, a silyl antimonide, an antimony amide, and an antimony alkyl.

In some embodiments, one of the first antimony precursor and the second antimony precursor comprises a chemical bond between antimony and a group 14 element. Thus, in some embodiments, one of the first antimony precursor and the second antimony precursors comprises an antimony germyl and an antimony silyl.

In some embodiments, the first antimony precursor comprises SbCl$_3$ and the second antimony precursor comprises Sb(Si(CH$_3$)$_3$)$_2$. In some embodiments, the first antimony precursor comprises SbCl$_3$ and the second antimony precursor comprises Sb(Si(CH$_3$)$_3$)$_3$.

In some embodiments, the second antimony precursor comprises SbCl$_3$ and the first antimony precursor comprises Sb(Si(CH$_3$)$_3$)$_2$. In some embodiments, the second antimony precursor comprises SbCl$_3$ and the first antimony precursor comprises Sb(Si(CH$_3$)$_3$)$_3$.

In some embodiments, the antimony precursor, for example at least one of the first antimony precursor and the second antimony precursor, comprises an antimony atom bonded to an alkyl and to a halogen, such as chlorine. Suitable precursors include RSbCl$_2$ and R$_2$SbCl; with R being a C1 to C6 alkyl such as methyl.

In some embodiments, the antimony precursor, for example at least one of the first antimony precursor and the second antimony precursor, comprises an alkylsilyl group and a halogen such as chlorine. Suitable antimony precursors include tris[bis(trimethylsilyl)methyl]antimony chloride, bis[bis(trimethylsilyl)methyl]antimony (III) chloride ([(Me$_3$Si)$_2$CH]$_2$SbCl), tris[(trimethylsilyl)methyl]antimony (III)dichloride ((Me$_3$Si)$_3$CSbCl$_2$), bis[(trimethylsilyl)methyl]antimony (III) dichloride ((Me$_3$Si)$_2$CHSbCl$_2$), and (bis[(trimethylsilyl)methyl]antimony [(Me$_3$Si)$_2$CH]$_3$Sb).

In some embodiments, the antimony precursor, for example at least one of the first antimony precursor and the second antimony precursor, comprises a silyl antimonide such as an alkylsilyl antimonide such as tris(trimethylsilyl) antimony (III) (Sb(SiMe$_3$)$_3$).

In some embodiments, the antimony precursor, for example at least one of the first antimony precursor and the second antimony precursor, comprises a germyl antimonide such as Sb(GeMe$_3$)$_3$.

In some embodiments, the antimony precursor, for example at least one of the first antimony precursor and the second antimony precursor, comprises an antimony halide such as antimony chloride, antimony bromide, or antimony iodide.

In some embodiments, the antimony precursor, for example at least one of the first antimony precursor and the second antimony precursor, comprises an antimony amide such as Sb(NMe$_2$)$_3$.

In some embodiments, the antimony precursor, for example at least one of the first antimony precursor and the second antimony precursor, comprises an antimony alkyl such as Sb(R)$_3$, with R being a C1 to C6 alkyl. For example, a suitable antimony alkyl can comprise Sb(Et)$_3$, with Et short for ethyl.

In some embodiments, the first chalcogen precursor is different from the second chalcogen precursor.

In some embodiments, the chalcogen precursor does not comprise oxygen.

In some embodiments, at least one of the first chalcogen precursor and the second chalcogen precursor comprises a sulfur precursor. Suitable sulfur precursors comprise H$_2$S and S$_2$.

In some embodiments, the first chalcogen precursor comprises a first selenium precursor or the second chalcogen precursor comprises a second selenium precursor.

In some embodiments, at least one of the first selenium precursor and the second selenium precursor comprise a compound selected from the list consisting of a selenium halide, a selenium alkoxide, and a selenium alkylsilyl.

In some embodiments, at least one of the first selenium precursor and the second selenium precursor comprises a chemical bond between selenium and a group 14 element. In some embodiments, at least one of the first selenium precursor and the second selenium precursor comprises a compound selected from selenium germyl and selenium silyl.

In some embodiments, the first selenium precursor comprises Se(GeMe$_3$)$_2$ and the second selenium precursor comprises Se(Si(CH$_3$)$_3$)$_2$.

In some embodiments, the second selenium precursor comprises Se(GeMe$_3$)$_2$ and the first selenium precursor comprises Se(Si(CH$_3$)$_3$)$_2$.

In some embodiments, the selenium precursor, for example at least one of the first selenium precursor and the second selenium precursor, comprises a selenium halide such as a selenium chloride. Suitable selenium chlorides include SeCl$_4$.

In some embodiments, the selenium precursor, for example at least one of the first selenium precursor and the second selenium precursor, comprises a selenium alkoxide.

Suitable selenium alkoxides can be represented by the formula $Se(OR)_4$, with R being an alkyl, such as a C1 to C6 alkyl, such as ethyl.

In some embodiments, the selenium precursor, for example at least one of the first selenium precursor and the second selenium precursor, comprises an alkylsilyl such as bis(trimethylsilyl) selenium (II).

In some embodiments, the selenium precursor, for example at least one of the first selenium precursor and the second selenium precursor, comprises a selenium amidinate.

In some embodiments, the first chalcogen precursor comprises a first tellurium precursor or the second chalcogen precursor comprises a second tellurium precursor. In some embodiments, the first chalcogen precursor and the second chalcogen precursor are independently selected from a sulfur precursor, a selenium precursor, and a tellurium precursor.

In some embodiments, at least one of the first tellurium precursor and the second tellurium precursor comprise a compound selected from the list consisting of a tellurium halide, a tellurium alkoxide, and a tellurium alkylsilyl.

In some embodiments, at least one of the first tellurium precursor and the second tellurium precursor comprises a chemical bond between tellurium and a group 14 element. In some embodiments, at least one of the first tellurium precursor and the second tellurium precursor comprises a compound selected from tellurium germyl and tellurium silyl.

In some embodiments, the first tellurium precursor comprises $Te(GeMe_3)_2$ and the second tellurium precursor comprises $Te(Si(CH_3)_3)_2$.

In some embodiments, the second tellurium precursor comprises $Te(GeMe_3)_2$ and the first tellurium precursor comprises $Te(Si(CH_3)_3)_2$.

In some embodiments, the tellurium precursor, for example at least one of the first tellurium precursor and the second tellurium precursor, comprises a tellurium halide such as a tellurium chloride. Suitable tellurium chlorides include $TeCl_4$.

In some embodiments, the tellurium precursor, for example at least one of the first tellurium precursor and the second tellurium precursor, comprises a tellurium alkoxide. Suitable tellurium alkoxides can be represented by the formula $Te(OR)_4$, with R being an alkyl, such as a C1 to C6 alkyl, such as ethyl.

In some embodiments, the tellurium precursor, for example at least one of the first tellurium precursor and the second tellurium precursor, comprises an alkylsilyl such as bis(trimethylsilyl) tellurium (II).

In some embodiments, the tellurium precursor, for example at least one of the first tellurium precursor and the second tellurium precursor, comprises a tellurium amidinate. Suitable tellurium amidinates are described in U.S. Pat. No. 9,537,095B2.

In some embodiments, at least one of the first group 14 element precursor, the first pnictogen precursor, and the first chalcogen precursor comprises a group 14 element bonded to one of another group 14 element, a pnictogen, or a chalcogen. In such embodiments, at least one of the second group 14 element precursor, the second pnictogen precursor, and the second chalcogen precursor can advantageously comprise a halogen.

In some embodiments, at least one of the first group 14 element precursor, the pnictogen precursor, and the chalcogen precursor comprises an alkylsilyl group such as a trimethylsilyl group bonded to one of a group 14 element, a pnictogen, or a chalcogen. In such embodiments, at least one of the second group 14 element precursor, the second pnictogen precursor, and the second chalcogen precursor can advantageously comprise a halide such as a chloride.

Further described herein is a system. The system comprises a reaction chamber. The reaction chamber comprises a substrate support. The system further comprises a gas injection system that is fluidly coupled to the reaction chamber. The system further comprises a group 14 element precursor gas source for introducing a first group 14 element precursor in the reaction chamber. The system further comprises a first pnictogen precursor gas source for introducing a first pnictogen precursor in the reaction chamber. The system further comprises a first chalcogen precursor gas source for introducing a first chalcogen precursor in the reaction chamber. The system further comprises one or more further precursor gas sources. Ones from the one or more further precursor gas sources are selected from a second group 14 element precursor gas source, a second pnictogen precursor gas source, and a second chalcogen precursor gas source. The second group 14 element precursor gas source that is constructed and arranged for introducing a second group 14 element precursor into the reaction chamber. The second group 14 element precursor is different than the first group 14 element precursor. The second pnictogen precursor gas source is constructed and arranged for introducing a second pnictogen precursor into the reaction chamber. The second pnictogen precursor is different from the first pnictogen precursor. The second chalcogen precursor gas source is constructed and arranged for introducing a second chalcogen precursor gas into the reaction chamber. The second chalcogen precursor is different from the first chalcogen precursor. The system further comprises an exhaust for removing reaction products and unreacted precursor from the reaction chamber. The system further comprises a controller. The controller is constructed and arranged for causing the system to carry out a method as described herein.

Further described herein is a system (100) comprising one or more reactor chambers (102). The system (100) further comprises a first group 14 element precursor storage module (105), a second group 14 element precursor storage module (106), a pnictogen precursor storage module (107), a chalcogen precursor storage module (108). The group 14 element precursor storage module comprises (105) a group 14 element precursor. The pnictogen precursor storage module (106) comprises a pictogen precursor. The chalcogen precursor storage module (108) comprises a chalcogen precursor.

While described with two group 14 element storage modules (105,106), such a system can, in some embodiments (not shown), comprise only one group 14 element storage module. In some embodiments, the system (100) comprises further storage modules. For example, the system can further comprise more than two group 14 element storage modules. For example, the system can further comprise a further pnictogen precursor storage module. For example, the system can further comprise a further chalcogen precursor storage module. Of course, other gas sources such as gas lines may be used as an alternative to the precursor storage modules.

The system further comprises an exhaust (110) for venting reactants and excess precursor from the one or more reaction chambers.

In some embodiments, the system (100) further comprises a controller (112). The controller (112) is configured to provide various gasses such as precursors and carrier gasses to the one or more reaction chambers in a cyclical deposition process as described herein.

In some embodiments, the reaction chamber (102) comprises a showerhead injector, or simply "showerhead", for providing the one or more group 14 element precursors, the one or more pnictogen precursors, and the one or more chalcogen precursors to the reaction chamber (102). In some embodiments, the showerhead includes a body having an opening, a first plate positioned within the opening and having a plurality of slots, a second plate positioned within the opening and having a plurality of slots. In some embodiments, each of the first plate plurality of slots are concentrically aligned with the second plate plurality of slots. In some embodiments, one or more of the group 14 element precursor, the pnictogen precursor, and the chalcogen precursor are provided to the reaction chamber via the first plate plurality of slots, and the other substances selected from the group 14 element precursor, the pnictogen precursor, and the chalcogen precursor are provided to the reaction chamber via the second plate plurality of slots.

In some embodiments, the first plate slots may extend towards the second plate slots. In some embodiments, the first plate slots may extend to a bottom surface of the second plate slots. The first and second plate slots may be oriented in a plurality of rings, wherein adjacent rings are offset with respect to one another. The first and second plate plurality of slots may be oriented in a plurality of rings, wherein every other ring is in alignment.

The system (100) of FIG. 1 can be used to perform a method as described herein and/or form a structure or device portion as described herein.

The reaction chamber (102) can include any suitable reaction chamber, such as an ALD reaction chamber.

The gas sources (105)-(108) can be coupled to the reaction chamber (102) via lines (115)-(118): a first group 14 element precursor line (115), a second group 14 element precursor line (116), a pnictogen precursor line (117), and a chalcogen precursor line (118). The lines (115-118) can each include flow controllers, valves, heaters, and the like. Optionally, the system can include any suitable number of additional gas sources. Optionally, the system can further describe a purge gas source (not shown in FIG. 1) which includes one or more inert gases as described herein.

Exhaust (110) can include one or more vacuum pumps.

Controller (112) includes electronic circuitry including a processor, and software to selectively operate valves, manifolds, heaters, pumps and other components included in the system (100). Such circuitry and components operate to introduce precursors, reactants, and optionally purge gases from the respective sources (104)-(108). The controller (112) can control timing of gas pulse sequences, temperature of the substrate and/or reaction chamber, pressure within the reaction chamber, and various other operations to provide proper operation of the system (100). The controller (112) can include control software to electrically or pneumatically control valves to control flow of precursors, reactants and purge gases into and out of the reaction chamber (102). Controller (112) can include modules such as a software or hardware component, e.g., a FPGA or ASIC, which performs certain tasks. It shall be understood that where the controller includes a software component to perform a certain task, the controller is programmed to perform that particular task. A module can advantageously be configured to reside on the addressable storage medium, i.e. memory, of the control system and be configured to execute one or more processes.

It will be appreciated that there are many arrangements of valves, conduits, precursor sources, and purge gas sources that may be used to accomplish the goal of feeding gases into the reaction chamber (102). Further, as a schematic representation of a system, many components have been omitted for simplicity of illustration, and such components may include, for example, various valves, manifolds, purifiers, heaters, containers, vents, and/or bypasses.

During operation of reactor system (100), substrates, such as semiconductor wafers (not illustrated), are transferred from, e.g., a substrate handling system to reaction chamber (102). Once the substrate(s) are transferred to the reaction chamber (102), one or more gases from the gas sources (105)-(108), such as precursors, reactants, carrier gases, and/or purge gases, are introduced into the reaction chamber (102).

Figure 2:
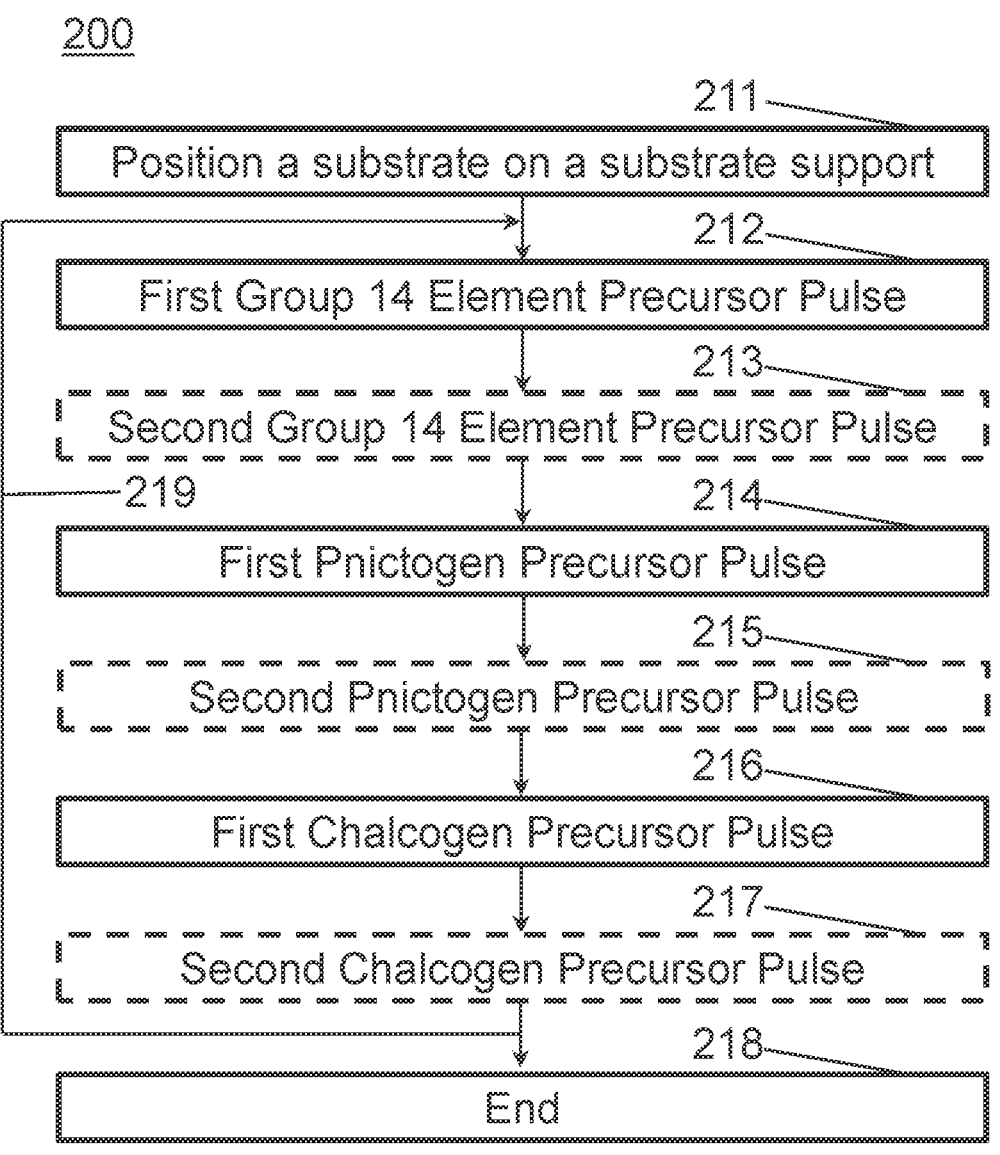
FIG. 2 describes an embodiment of a method (200) as described herein.

FIG. 2 describes an embodiment of a method (200) as described herein. The method (200) comprises a step (211) of positioning a substrate on a substrate support. Then, the method comprises carrying out a plurality of deposition cycles (219). A deposition cycle (219) comprises a first group 14 element precursor pulse (212), a first pnictogen precursor pulse (214), and a first chalcogen precursor pulse (216). Optionally, a deposition cycle (219) further comprises one or more of a second group 14 element precursor pulse (213) following the first group 14 element precursor pulse (212), a second pnictogen precursor pulse (215) following the first pnictogen precursor pulse (214), and a second chalcogen precursor pulse (217) following the first chalcogen precursor pulse (216).

The first group 14 element precursor pulse (212) comprises providing a first group 14 element precursor to the reaction chamber. If present, the second group 14 element precursor pulse (213) comprises providing a second group 14 element precursor to the reaction chamber. The first group 14 element precursor and the second group 14 element precursor are different.

The first group pnictogen precursor pulse (214) comprises providing a first pnictogen precursor to the reaction chamber. If present, the second pnictogen precursor pulse (215) comprises providing a second pnictogen precursor to the reaction chamber. The first pnictogen precursor and the second pnictogen precursor are different.

The first chalcogen precursor pulse (216) comprises providing a first chalcogen precursor to the reaction chamber. If present, the second chalcogen precursor pulse (217) comprises providing a second chalcogen precursor to the reaction chamber. The first chalcogen precursor and the second chalcogen precursor are different.

Advantageously, a method according to the embodiment of FIG. 2 allows efficiently forming layers having a predetermined composition.

Figure 3:
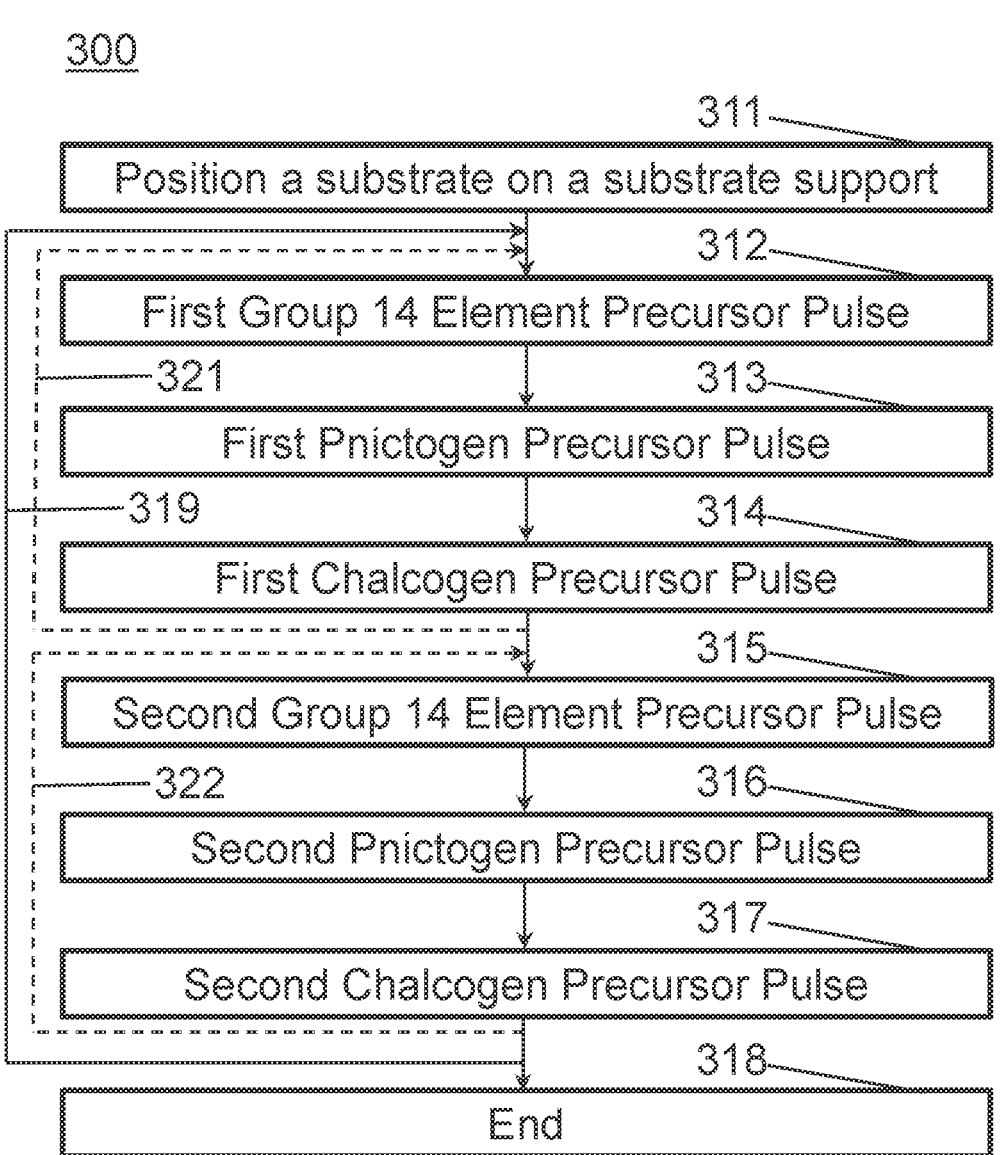
FIG. 3 describes an embodiment of a method (300) as described herein.

FIG. 3 describes an embodiment of a method (300) as described herein. The method (300) comprises a step (311) of positioning a substrate on a substrate support. The method (300) further comprises executing a plurality of super cycles (319). A super cycle (319) comprises one or more first sub cycles (321) and one or more second sub cycles (322).

Ones from the one or more first sub cycles (321) comprise a first group 14 element precursor pulse (312), a first pnictogen precursor pulse (313), and a first chalcogen precursor pulse (314).

Ones from the one or more second sub cycles (322) comprise a second group 14 element precursor pulse (315), a second pnictogen reactant pulse (316), and a second chalcogen reactant pulse (317)

After the plurality of super cycles (319) have been executed, the method ends (318).

A super cycle (319) can comprise a suitable amount of first sub cycles (321) and second sub cycles (322). The amount of first sub cycles and second sub cycles can suitably be selected to control the composition of the layer that is formed by means of the method (300) according to the embodiment of FIG. 3. For example: In some embodiments, a super cycle (319) comprises one first sub cycle (321) and one second sub cycle (322). In some embodiments, a super cycle (319) comprises one first sub cycle (321) and two second sub cycles (322). In some embodiments, a super cycle (319) comprises two first sub cycles (321) and one second sub cycle (322). In some embodiments, a super cycle (319) comprises two first sub cycles (321) and three second sub cycles (322). In some embodiments, a super cycle (319) comprises three first sub cycles (321) and two second sub cycles (322). In some embodiments, a super cycle (319) comprises four first sub cycles (321) and one second sub cycle (322). In some embodiments, a super cycle (319) comprises one first sub cycle (321) and four second sub cycles (322).

Figure 4:
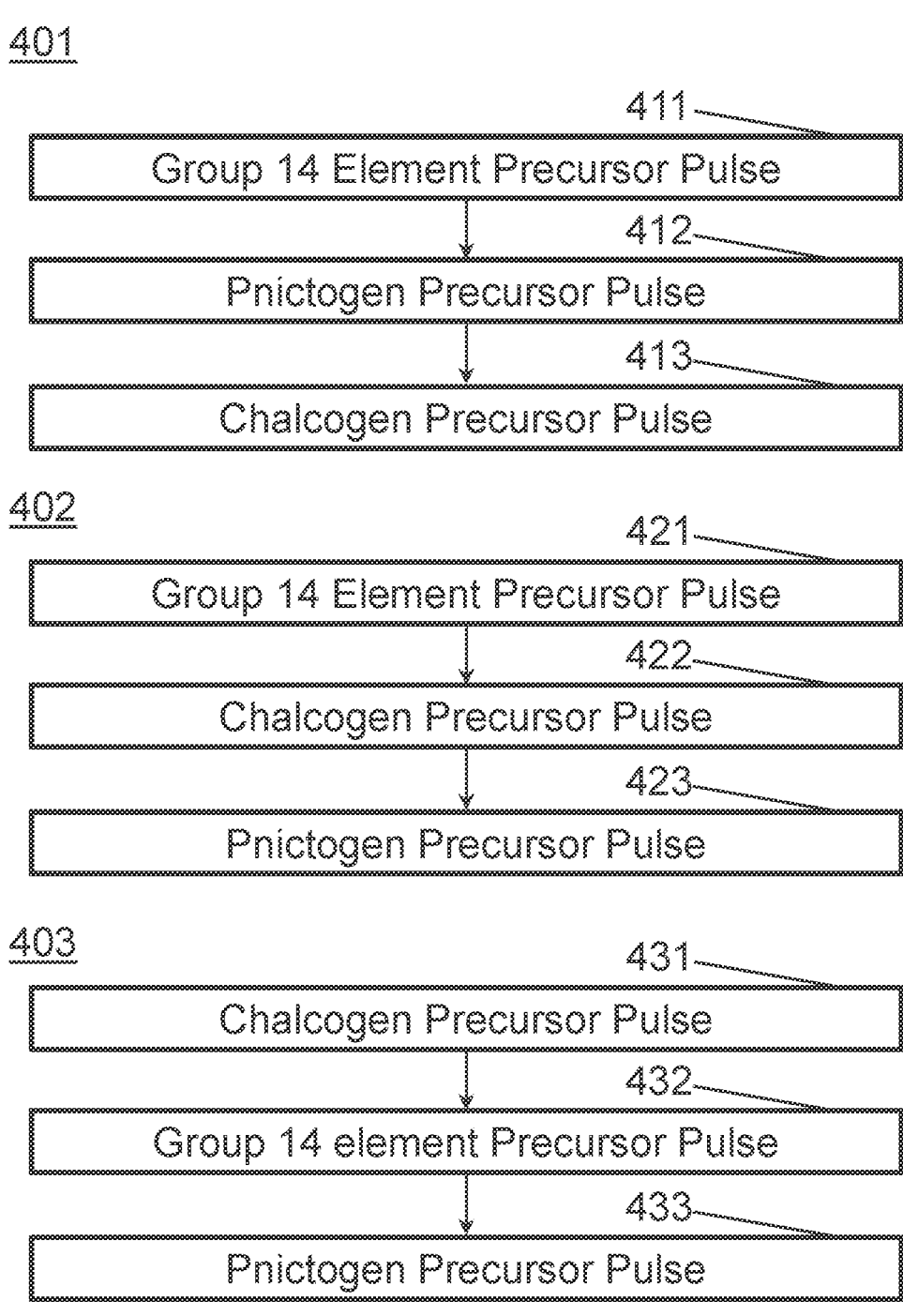
FIG. 4 describes a deposition cycle (401) that first comprises executing a group 14 element precursor pulse (411), then a pnictogen precursor pulse (412), and then a chalcogen precursor pulse (413).
Figure 5:
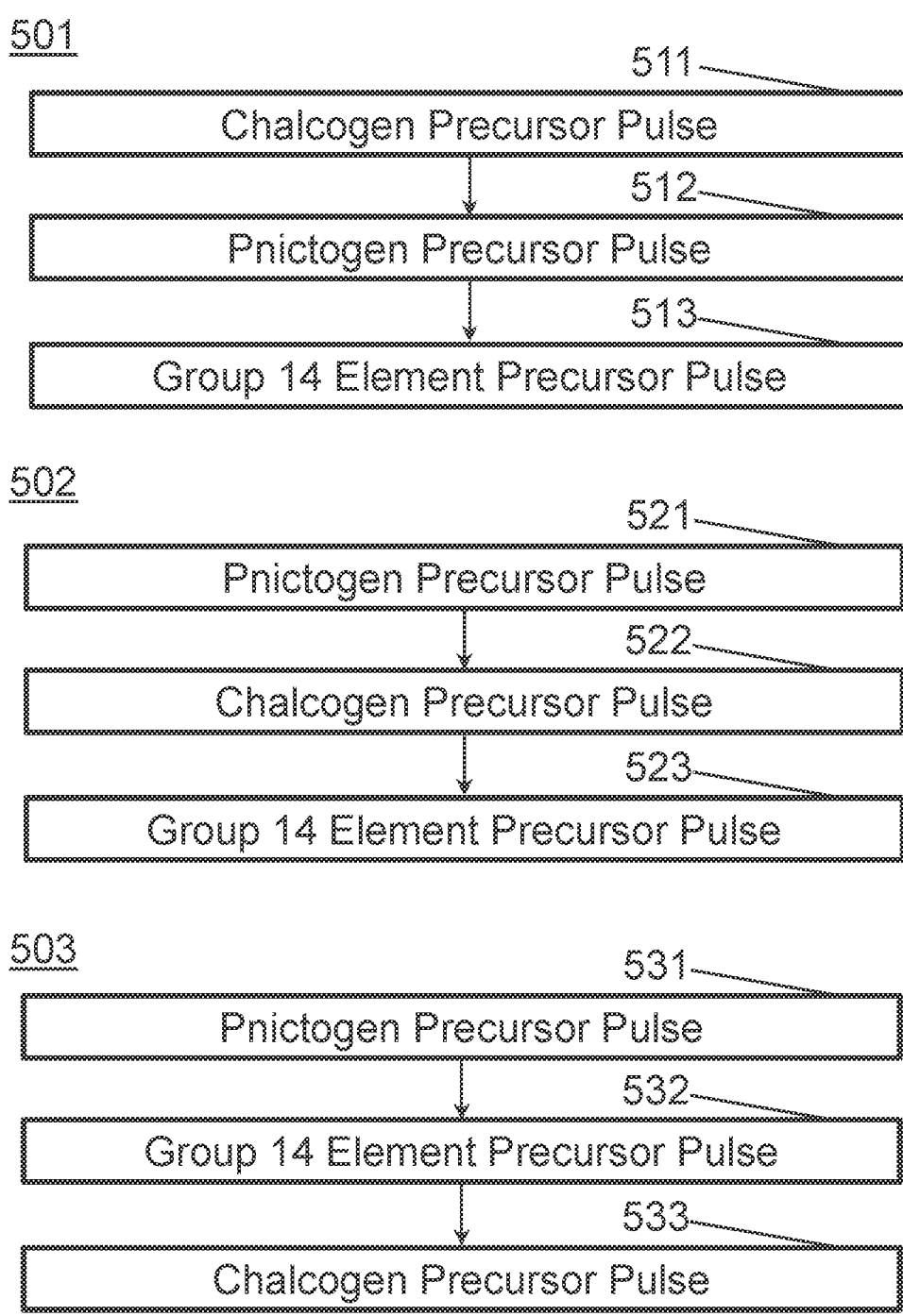
FIG. 5 describes a deposition cycle (501) that first comprises executing a chalcogen precursor pulse (511), then a pnictogen precursor pulse (512), and then a group 14 element precursor pulse (513).

A method as described herein is generally described as comprising one or more group 14 element precursor pulses, then one or more pnictogen precursor pulses, and then one or more chalcogen precursor pulses. This notwithstanding, various pulsing sequences can be used as an alternative. Such alternative pulsing sequences may help obtaining a desired layer composition. FIGS. 4 and 5 describe various alternative pulsing sequences. In particular:

FIG. 4 describes a deposition cycle (401) that first comprises executing a group 14 element precursor pulse (411), then a pnictogen precursor pulse (412), and then a chalcogen precursor pulse (413).

FIG. 4 further describes a deposition cycle (402) that first comprises executing a group 14 element precursor pulse (421), then a chalcogen precursor pulse (422), and then a pnictogen precursor pulse (423).

FIG. 4 further describes a deposition cycle (403) that first comprises executing a group chalcogen precursor pulse (431), then a group 14 element precursor pulse (432), and then a pnictogen precursor pulse (433).

FIG. 5 describes a deposition cycle (501) that first comprises executing a chalcogen precursor pulse (511), then a pnictogen precursor pulse (512), and then a group 14 element precursor pulse (513).

FIG. 5 further describes a deposition cycle (502) that first comprises executing a pnictogen precursor pulse (521), then a chalcogen precursor pulse (522), and then a group 14 element precursor pulse (523).

FIG. 5 further describes a deposition cycle (503) that first comprises executing a pnictogen precursor pulse (531), then a group 14 element precursor pulse (532), and then a chalcogen precursor pulse (533).

The method (300) of the embodiment of FIG. 3 is shown as comprising distinct first precursor pulses and second precursor pulses. While this is certainly a possibility, there exist alternative embodiments as well. Various pulsing schemes are discussed in the context of FIG. 6, in which the horizontal axis denotes time.

Figure 6:
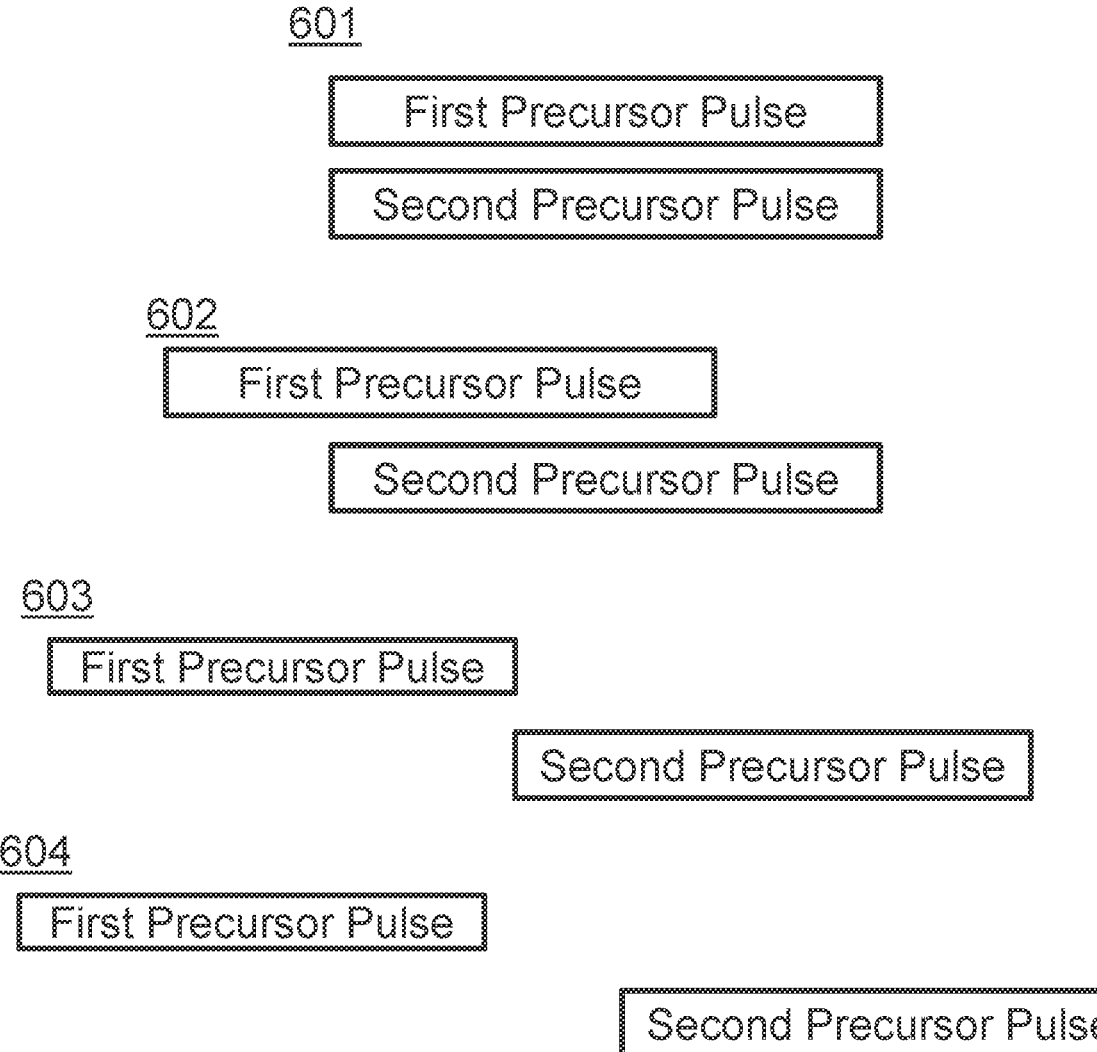
FIG. 6 describes an embodiment (601) in which a first precursor and a second precursor are simultaneously provided to a reaction chamber.

FIG. 6 describes an embodiment (601) in which a first precursor and a second precursor are simultaneously provided to a reaction chamber, i.e. in which a first precursor pulse and a second precursor pulse.

FIG. 6 further describes an embodiment (602) in which a first precursor pulse and a second precursor pulse overlap partially but not wholly.

FIG. 6 further describes an embodiment (603) in which a first precursor pulse and a second precursor pulse do not overlap, and in which the second precursor pulse directly follows the first precursor pulse without any intervening purge.

FIG. 6 further describes an embodiment (604) in which a first precursor pulse and a second precursor pulse do not overlap, and in which the second precursor pulse is separated from the first precursor by an intervening purge, i.e. by a period in time in which no precursor is provided to the reaction chamber.

A method as described herein, for example using a pulsing scheme according to the method (200) of FIG. 2 or the method (300) of FIG. 3, can comprise forming a layer comprising germanium, tellurium, and antimony. Thus, the first and second group 14 element precursors can comprise germanium precursors, the first and second pnictogen precursors can comprise antimony precursors, and the first and second chalcogen precursors can comprise tellurium precursors.

In some embodiments, the first germanium precursor comprises a germanium halide such as a germanium chloride such as $GeCl_4$ and the second germanium precursor can comprise the same or a different germanium halide, for example a compound comprising germanium, hydrogen, and chlorine, such as $GeHCl_3$.

In some embodiments, the first tellurium precursor comprises a tellurium alkylgermyl such as $Te(GeMe_3)_2$ and the second tellurium precursor comprises a tellurium alkylsilyl such as $Te(SiMe_3)_2$.

In some embodiments, the first antimony precursor comprises an antimony halide, such as an antimony chloride, such as $SbCl_3$, and the second antimony precursor comprises an antimony alkylsilyl such as $Sb(SiCH_3)_2$ or $Sb(SiCH_3)_3$.

In some embodiments, a single germanium precursor, a single antimony precursor, and two different tellurium precursors are used in a pulsing scheme (200) according to the embodiment of FIG. 2. The germanium precursor comprises $GeCl_4$, the antimony precursor comprises $Sb(SiCH_3)_3$, the first tellurium precursor comprises $Te(GeMe_3)_2$, and the second tellurium precursor comprises $Te(GeMe_3)_2$. By selecting suitable pulsing ratios, i.e. suitable amounts of the various precursor pulses, the layer can be controlled to have a suitable, pre-determined, composition. Advantageously, such layers with a controlled, pre-determined composition, can be conformally deposited using methods as described herein, even in high-aspect ratio structures with re-entrant features. It can be difficult, if not impossible, to form conformal layers using prior art techniques such as chemical vapor deposition and physical vapor deposition in high-aspect ratio structures with re-entrant features.

In an exemplary embodiment, a germanium antimony telluride layer can be formed by cyclically repeating the following sequence of pulses a predetermined amount of times: a first germanium precursor pulse that comprises exposing a substrate to $GeCl_2$:Dioxane, a purge step, a second germanium precursor pulse that comprises exposing the substrate to $GeHCl_3$, a further purge step, a tellurium precursor pulse that comprises exposing the substrate to $Te(Si(CH_3)_3)_2$, a further purge step, an antimony precursor pulse that comprises exposing the substrate to $SbCl_3$.

In an exemplary embodiment, a germanium telluride layer can be formed by cyclically repeating the following sequence of pulses a predetermined amount of times: a first germanium precursor pulse that comprises exposing a substrate to $GeCl_2$:Dioxane, a purge step, a second germanium precursor pulse that comprises exposing the substrate to $GeHCl_3$, a further purge step, a tellurium precursor pulse that comprises exposing the substrate to $Te(Si(CH_3)_3)_2$, and a further purge step. Advantageously, such germanium telluride films can have an increased germanium content compared to films grown using only a single germanium precursor. Also, films grown using two different germanium precursors were found to have reduced surface roughness, reduced amounts of islands, and more continuous films.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming a layer comprising a group 14 element, a pnictogen, and a chalcogen, the method comprising:

providing a substrate to a reaction chamber; and executing a plurality of deposition cycles, a deposition cycle comprising a group 14 element pulse, a pnictogen pulse, and a chalcogen pulse, wherein the group 14 element pulse comprises providing a first group 14 element precursor to the reaction chamber;

the pnictogen pulse comprises providing a first pnictogen precursor to the reaction chamber; and, the chalcogen pulse comprises providing a first chalcogen precursor to the reaction chamber, wherein the method further comprises providing one or more further precursors to the reaction chamber, the one or more further precursors is a precursor selected from a second group 14 element precursor different than the first group 14 element precursor, and/or a second pnictogen precursor different from the first pnictogen precursor, and a second chalcogen precursor different from the first chalcogen precursor and wherein the first group 14 element precursor comprises a first germanium precursor and the second group 14 element precursor comprises a second germanium precursor, wherein at least one of the first germanium precursor and the second germanium precursor comprises a germanium amidinate, or a germanium amide; and/or wherein the first pnictogen precursor comprises a first antimony precursor and wherein the second pnictogen precursor comprises a second antimony precursor, wherein at least one of the first antimony precursor and the second antimony precursor independently comprises a compound selected from the group consisting of a silyl antimonide, an antimony amide, and a heteroleptic antimony precursor comprising an alkylsilyl group and a halogen.

2. The method according to claim 1, wherein the one or more further precursors comprises the second group 14 element precursor, and wherein the group 14 element pulse further comprises providing the second group 14 element precursor to the reaction chamber.

3. The method according to claim 1, wherein the one or more further precursors comprises the second pnictogen precursor, and wherein the pnictogen pulse further comprises providing the second pnictogen precursor to the reaction chamber.

4. The method according to claim 1, wherein the one or more further precursors further comprises a second chalcogen precursor different from the first chalcogen precursor, wherein the chalcogen pulse further comprises the second chalcogen precursor to the reaction chamber.

5. The method according to claim 1, wherein one of the first germanium precursor and the second germanium precursor comprises a germanium halide.

6. The method according to claim 5, the germanium halide precursor comprises $GeHCl_3$.

7. The method according to claim 1, wherein one of the first antimony precursor and the second antimony precursor comprises a compound selected from the group consisting of an antimony halide, and an antimony alkyl.

8. The method according to claim 7, wherein one of the first antimony precursor and the second antimony precursor comprises a chemical bond between antimony and a group 14 element.

9. The method according to claim 1, wherein the first chalcogen precursor comprises a first tellurium precursor or wherein the second chalcogen precursor comprises a second tellurium precursor.

10. The method according to claim 9, wherein at least one of the first tellurium precursor and the second tellurium precursor comprises a compound selected from the group consisting of a tellurium halide, a tellurium alkoxide, and a tellurium alkylsilyl.

11. The method according to claim 10, wherein one of the first tellurium precursor and the second tellurium precursor comprises a chemical bond between tellurium and a group 14 element.

12. A method of forming a layer comprising a group 14 element, a pnictogen, and a chalcogen, the method comprising:

providing a substrate to a reaction chamber; and executing a plurality of deposition cycles, at least one deposition cycle of the plurality of deposition cycles comprises a first sub cycle and a second sub cycle, the first sub cycle comprising a first group 14 element pulse, a first pnictogen pulse, and a first chalcogen pulse, wherein the first group 14 element pulse comprises providing a first group 14 element precursor to the reaction chamber;

the first pnictogen pulse comprises providing a first pnictogen precursor to the reaction chamber; and, the first chalcogen pulse comprises providing a first chalcogen precursor to the reaction chamber, the second sub cycle comprising a second group 14 element pulse, a second pnictogen pulse, and a second chalcogen pulse, wherein the second group 14 element pulse comprises providing a second group 14 element precursor to the reaction chamber;

the second pnictogen pulse comprises providing a second pnictogen precursor to the reaction chamber; and, the second chalcogen pulse comprises providing a second chalcogen precursor to the reaction chamber, wherein the first group 14 element precursor is different from the second group 14 element precursor, wherein the first group 14 element precursor comprises a first germanium precursor and the second group 14 element precursor comprises a second germanium precursor, wherein at least one of the first germanium precursor and the second germanium precursor comprises a germanium amidinate or a germanium amide, and/or wherein the first pnictogen precursor is different from the second pnictogen precursor, wherein the first pnictogen precursor comprises a first antimony precursor and the second pnictogen precursor comprises a second antimony precursor, wherein at least one of the first antimony precursor and the second antimony precursor independently comprises a compound selected from the group consisting of a silyl antimonide, an antimony amide, and a heteroleptic antimony precursor comprising an alkylsilyl group and a halogen.

13. The method according to claim 12, wherein one of the first germanium precursor and the second germanium precursor comprises a germanium halide.

14. The method according to claim 13, wherein the germanium halide precursor comprises GeHCl₃.

15. The method according to claim 1, wherein the first chalcogen precursor is different from the second chalcogen precursor.

16. The method according to claim 15, wherein the first chalcogen precursor comprises a first tellurium precursor and wherein the second chalcogen precursor comprises a second tellurium precursor.

17. The method according to claim 16, wherein at least one of the first tellurium precursor and the second tellurium precursor comprises a compound selected from the group consisting of a tellurium halide, a tellurium alkoxide, a tellurium alkylsilyl, and tellurium alkylgermyl.

18. The method according to claim 13, wherein at least one deposition cycle of the plurality of deposition cycles comprises more than one first sub cycle.

19. The method according to claim 13, wherein at least one deposition cycle of the plurality of deposition cycles comprises more than one second sub cycle.

* * * * *